US012813135B2

(12) United States Patent
Chen et al.

(10) Patent No.: US 12,813,135 B2
(45) Date of Patent: Nov. 24, 2026

(54) DISPLAY PANELS AND DISPLAY DEVICES INCLUDING ELECTRICALLY CONNECTED LEADING AND SIGNAL WIRING

(71) Applicant: WUHAN CHINA STAR OPTOELECTRONICS SEMICONDUCTOR DISPLAY TECHNOLOGY CO., LTD., Wuhan (CN)

(72) Inventors: E Chen, Wuhan (CN); Fei Zuo, Wuhan (CN); Cong Min, Wuhan (CN); Xingyong Zhang, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 478 days.

(21) Appl. No.: 18/260,042

(22) PCT Filed: Apr. 21, 2023

(86) PCT No.: PCT/CN2023/089783
§ 371 (c)(1),
(2) Date: Jun. 30, 2023

(87) PCT Pub. No.: WO2024/178817
PCT Pub. Date: Sep. 6, 2024

(65) Prior Publication Data

US 2024/0381742 A1 Nov. 14, 2024

(30) Foreign Application Priority Data

Feb. 28, 2023 (CN) ........................ 202310195825.2

(51) Int. Cl.
*H10K 59/80* (2023.01)
*H10K 59/124* (2023.01)
*H10K 59/131* (2023.01)

(52) U.S. Cl.
CPC ......... *H10K 59/873* (2023.02); *H10K 59/124* (2023.02); *H10K 59/131* (2023.02)

(58) Field of Classification Search
CPC .. H10K 59/873; H10K 59/124; H10K 59/131; H10K 59/122; H10K 59/80;
(Continued)

(56) References Cited

U.S. PATENT DOCUMENTS

2015/0380474 A1* 12/2015 Lee ...................... H10K 59/875 257/40
2019/0288234 A1* 9/2019 Kim ..................... H10K 59/122
(Continued)

FOREIGN PATENT DOCUMENTS

CN 109817681 A 5/2019
CN 110323228 A 10/2019
(Continued)

OTHER PUBLICATIONS

Korean Office Action issued in corresponding Japanese Patent Application No. 10-2023-7041030 dated Jan. 6, 2025 pp. 1-10.
(Continued)

*Primary Examiner* — Ida M Soward
(74) *Attorney, Agent, or Firm* — PV IP PC; Peter Stecher; Wei Te Chung

(57) ABSTRACT

A display panel includes a display area and a frame area adjacent to the display area. The frame area includes a substrate, and a signal wiring, a planarization layer, a leading wiring, and an encapsulation layer sequentially disposed on the substrate, and the encapsulation layer includes a first inorganic layer disposed on the leading wiring. The display
(Continued)

area includes the substrate, the planarization layer, and an anode disposed on a side of the planarization layer away from the substrate, and the leading wiring extends from the side of the anode to the frame area and is connected to the signal wiring. The display panel further includes a barrier layer disposed between the leading wiring and the first inorganic layer, and an orthographic projection of the barrier layer on the substrate covers an orthographic projection of the leading wiring on the substrate.

19 Claims, 3 Drawing Sheets

(58) Field of Classification Search
CPC .... H10K 59/00; H10K 59/10; H10K 59/8722; H10K 59/8731; H10K 59/87; H10K 59/8051; H10K 59/8052; H10K 59/8791; H10K 50/84; H10K 77/10
See application file for complete search history.

(56) References Cited

U.S. PATENT DOCUMENTS

| | | | | |
|---|---|---|---|---|
| 2019/0341439 | A1* | 11/2019 | Choi | H10K 59/131 |
| 2020/0212115 | A1* | 7/2020 | Choi | H10K 59/124 |
| 2021/0126224 | A1* | 4/2021 | Lee | H10K 59/124 |
| 2022/0190291 | A1* | 6/2022 | Sonoda | G09F 9/00 |
| 2023/0024691 | A1* | 1/2023 | So | H10K 50/8426 |
| 2023/0232661 | A1* | 7/2023 | Qu | H10K 59/1213<br>257/40 |

FOREIGN PATENT DOCUMENTS

| | | | | |
|---|---|---|---|---|
| CN | 112289948 A | | 1/2021 | |
| CN | 113314571 A | | 8/2021 | |
| CN | 113725380 A | | 11/2021 | |
| CN | 114122021 A | * | 3/2022 | H10D 86/60 |
| EP | 3276665 A1 | * | 1/2018 | H10K 59/12 |
| KR | 20190004407 A | | 1/2019 | |
| KR | 20200081628 A | | 7/2020 | |
| KR | 20210032599 A | | 3/2021 | |
| KR | 20210135436 A | | 11/2021 | |
| WO | WO-2018142739 A1 | * | 8/2018 | G06F 3/0445 |

OTHER PUBLICATIONS

International Search Report in International application No. PCT/CN2023/089783, mailed on Nov. 8, 2023.
Written Opinion of the International Search Authority in International application No. PCT/CN2023/089783, mailed on Nov. 8, 2023.
Korean Office Action issued in corresponding Korean Patent Application No. 10-2025-7040596 dated Jul. 1, 2026, pp. 1-7.

* cited by examiner

DISPLAY PANELS AND DISPLAY DEVICES INCLUDING ELECTRICALLY CONNECTED LEADING AND SIGNAL WIRING

CROSS REFERENCE TO RELATED APPLICATIONS

This application claims priority to and the benefit of International Application No. PCT/CN2023/089783, filed on Apr. 21, 2023 and Chinese Patent Application No. 202310195825.2, filed on Feb. 28, 2023. The disclosures of the aforementioned applications are incorporated herein by reference in their entireties.

TECHNICAL FIELD

The present disclosure relates to display technology, in particular to display panels and display devices including the same.

BACKGROUND

At present, the thin film encapsulation of most organic light-emitting diodes (OLEDs) devices adopts a structure of stacking with multi-layers that include inorganic layers and organic layers. After analysis, it was found that increasing the number of stacking times under a fixed thickness can effectively improve water and oxygen resistance effect, that is, a thickness of a single layer decreases while the number of interfaces increases, which increases the path of water oxygen diffusion and prolongs the time of water oxygen invasion. When the thickness of the inorganic layers increases, the stress and defect density of the inorganic layers increase, weakening the encapsulation performance. The increase of the organic layer releases the inorganic layer stress on the one hand, and covers the defect position on the other hand, which improves the water resistance of the entire structure.

In the existing art, a plasma enhanced chemical vapor deposition (PECVD) method is generally used to manufacture the inorganic layer(s) in an encapsulation layer. Referring to FIG. 1, it is a schematic structural diagram of a display panel in the existing art. In the display panel 1 of the existing art, a display area 1000 includes a substrate 10, a planarization layer 30, an anode 41, a pixel definition layer 50, a light-emitting layer 60, a cathode 70, and a light-extracting layer 81; and a frame area 2000 includes the substrate 10, a signal wiring 21, the planarization layer 30, and a leading wiring 42 sequentially disposed on the substrate 10. The leading wiring 42 includes an overlapping part 421 and an exposing part 422 disposed at a side of the overlapping part 421 away from the display area. An orthogonal projection of the light-extracting layer 81 on the substrate 10 covers an orthogonal projection of the overlapping part 421 on the substrate 10, and does not overlap with an orthogonal projection of the exposing part 422 on the substrate 10. In practice, during the production of a first inorganic layer 91 of an encapsulation layer 90, the exposing part 422 may be bombarded by plasma, and metal ions present in the leading wiring 42 are bombarded out by the plasma and attached to the edges of a mask, which changes the magnetic field, thereby affecting the distribution of plasma gas, resulting in uneven film thickness at the edges of the mask, affecting the ability of the first inorganic layer 91 to block water and oxygen.

SUMMARY

Embodiments of the present disclosure provide a display panel and a display device, which can avoid the presence of an uneven thickness of inorganic layers.

To achieve the above-mentioned function, technical solutions provided by embodiments of the present disclosure are as follows.

An embodiment of the present disclosure provides a display panel, which includes a display area and a frame area adjacent to the display area;

the frame area includes a substrate, and a signal wiring, a planarization layer, a leading wiring, and an encapsulation layer sequentially stacked on the substrate; and the encapsulation layer includes a first inorganic layer disposed on the leading wiring;

the display area includes the substrate, the planarization layer, and an anode disposed on a side of the planarization layer away from the substrate, and the leading wiring extends from a side of the anode into the frame area and is connected to the signal wiring; and the display panel includes a barrier layer disposed between the leading wiring and the first inorganic layer, and an orthographic projection of the barrier layer on the substrate covers an orthographic projection of the leading wiring on the substrate.

In the display panel provided by an embodiment of the present disclosure, the display panel includes a dam part disposed between the planarization layer and the encapsulation layer, and the dam part is disposed at a side of the leading wiring away from the display area; and the barrier layer directly contacts with a side of the dam part close to the leading wiring in the frame area.

In the display panel provided by an embodiment of the present disclosure, the dam part includes a first dam and a second dam spaced apart, and the first dam is located at a side of the second dam close to the display area; and a height of the first dam is greater than a thickness of the leading wiring, the leading wiring extends from a side of the anode to the first dam, and the barrier layer directly contacts with a side of the first dam close to the leading wiring.

In the display panel provided by an embodiment of the present disclosure, the display area includes a pixel definition layer, a light-emitting layer, a common layer, and a cathode sequentially stacked on the anode, and the first inorganic layer is disposed on a side of the cathode away from the common layer; and the barrier layer includes a light-extracting layer disposed between the cathode and the first inorganic layer, and an orthographic projection of the light-extracting layer on the substrate covers an orthographic projection of the light-emitting layer on the substrate.

In the display panel provided by an embodiment of the present disclosure, the light-extracting layer extends from the display area to the first dam and directly contacts with a side of the first dam close to the leading wiring; and the orthographic projection of the light-extracting layer on the substrate covers the orthographic projection of the leading wiring on the substrate.

In the display panel provided by an embodiment of the present disclosure, the leading wiring includes an overlapping part and an exposing part disposed at a side of the overlapping part away from the display area;

the light-extracting layer extends from the display area towards a direction close to the leading wiring and directly contacts the overlapping part, and the orthogonal projection of the light-extracting layer on the substrate covers an orthogonal projection of the overlapping part on the substrate; and the barrier layer includes a barrier sub-layer extending from a side of the light-extracting layer to the first dam, and an orthogonal projection of the barrier sub-layer on the substrate covers an orthogonal projection of the exposing part on the substrate.

In the display panel provided by an embodiment of the present disclosure, the barrier layer includes a barrier sub-layer disposed between the light-extracting layer and the first inorganic layer, and extends from the display area to the first dam, and an orthogonal projection of the barrier sub-layer on the substrate covers the orthogonal projection of the leading wiring on the substrate.

In the display panel provided by an embodiment of the present disclosure, the barrier sub-layer is made of at least one material selected from magnesium fluoride, aluminum fluoride, sodium fluoride, and lithium fluoride.

In the display panel provided by an embodiment of the present disclosure, the leading wiring includes a plurality of hollow holes passing through the leading wiring in a direction perpendicular to the substrate.

In the display panel provided by an embodiment of the present disclosure, the hollow holes have a shape selected from rectangle, circle, and triangle.

An embodiment of the present disclosure provides a display device including a display panel which includes a display area and a frame area adjacent to the display area;

the frame area includes a substrate, and a signal wiring, a planarization layer, a leading wiring, and an encapsulation layer sequentially stacked on the substrate; and the encapsulation layer includes a first inorganic layer disposed on the leading wiring;

the display area includes the substrate, the planarization layer, and an anode disposed on a side of the planarization layer away from the substrate, and the leading wiring extends from a side of the anode into the frame area and is connected to the signal wiring; and the display panel includes a barrier layer disposed between the leading wiring and the first inorganic layer, and an orthographic projection of the barrier layer on the substrate covers an orthographic projection of the leading wiring on the substrate.

In the display device provided by an embodiment of the present disclosure, the display panel includes a dam part disposed between the planarization layer and the encapsulation layer, and the dam part is disposed at a side of the leading wiring away from the display area; and the barrier layer directly contacts with a side of the dam part close to the leading wiring in the frame area.

In the display device provided by an embodiment of the present disclosure, the dam part includes a first dam and a second dam spaced apart, and the first dam is located at a side of the second dam close to the display area; and a height of the first dam is greater than a thickness of the leading wiring, the leading wiring extends from a side of the anode to the first dam, and the barrier layer directly contacts with a side of the first dam close to the leading wiring.

In the display device provided by an embodiment of the present disclosure, the display area includes a pixel definition layer, a light-emitting layer, a common layer, and a cathode sequentially stacked on the anode, and the first inorganic layer is disposed on a side of the cathode away from the common layer; and the barrier layer includes a light-extracting layer disposed between the cathode and the first inorganic layer, and an orthographic projection of the light-extracting layer on the substrate covers an orthographic projection of the light-emitting layer on the substrate.

In the display device provided by an embodiment of the present disclosure, the light-extracting layer extends from the display area to the first dam and directly contacts with a side of the first dam close to the leading wiring; and the orthographic projection of the light-extracting layer on the substrate covers the orthographic projection of the leading wiring on the substrate.

In the display device provided by an embodiment of the present disclosure, the leading wiring includes an overlapping part and an exposing part disposed at a side of the overlapping part away from the display area;

the light-extracting layer extends from the display area towards a direction close to the leading wiring and directly contacts the overlapping part, and the orthogonal projection of the light-extracting layer on the substrate covers an orthogonal projection of the overlapping part on the substrate; and the barrier layer includes a barrier sub-layer extending from a side of the light-extracting layer to the first dam, and an orthogonal projection of the barrier sub-layer on the substrate covers an orthogonal projection of the exposing part on the substrate.

In the display device provided by an embodiment of the present disclosure, the barrier layer includes a barrier sub-layer disposed between the light-extracting layer and the first inorganic layer and extends from the display area to the first dam, and an orthogonal projection of the barrier sub-layer on the substrate covers the orthogonal projection of the leading wiring on the substrate.

In the display device provided by an embodiment of the present disclosure, the barrier sub-layer is made of at least one material selected from magnesium fluoride, aluminum fluoride, sodium fluoride, and lithium fluoride.

In the display device provided by an embodiment of the present disclosure, the leading wiring includes a plurality of hollow holes passing through the leading wiring in a direction perpendicular to the substrate.

In the display device provided by an embodiment of the present disclosure, the hollow holes have a shape selected from rectangle, circle, and triangle.

BENEFICIAL EFFECTS

Embodiments of the present disclosure provide a display panel and a display device. By designing a barrier layer being disposed between a leading wiring and a first inorganic layer, and an orthogonal projection of the barrier layer on a substrate covering an orthogonal projection of the leading wiring on the substrate, the present disclosure avoids the bombarding damage of high-energy plasma to the leading wiring when using the plasma enhanced chemical vapor deposition method to prepare the first inorganic layer in the existing art, avoiding the presence of an uneven thickness of the first inorganic layer.

DESCRIPTION OF DRAWINGS

Technical solutions and other beneficial effects of the present disclosure will be apparent through detailed description of specific implementation of the present disclosure in combination with attached drawings.

DETAILED DESCRIPTION

Figure 1:
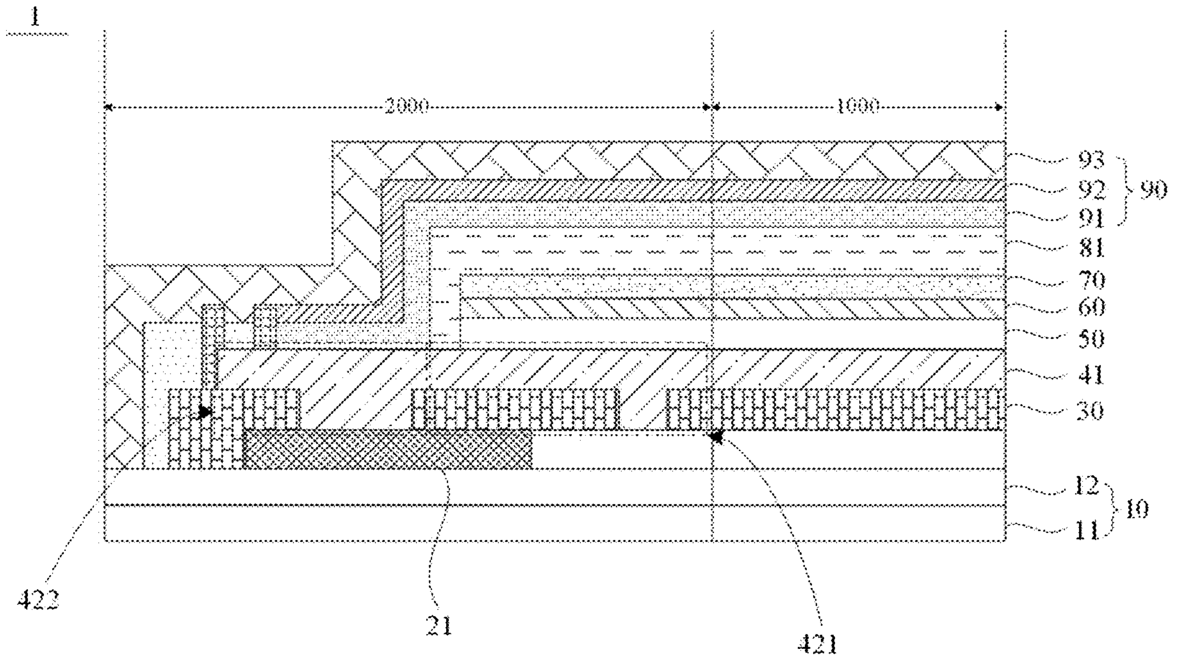
FIG. 1 is a schematic structural diagram of a display panel in the existing art.

In combination with drawings in embodiments of the present disclosure, technical solutions in the embodiments of the present disclosure will be described clearly and completely. Apparently, the described embodiments are only part of the embodiments of the present disclosure, not all of them. Based on the embodiments of the present disclosure, all other embodiments obtained by those skilled in the art without creative effort belong to a scope of the present disclosure.

Embodiments of the present disclosure provide a display panel and a display device. The following is described in detail. It should be noted that a description order of the following embodiments does not serve as a limitation on a preferred order of the embodiments. In addition, in description of the present disclosure, terms "include" refers to "include but not limited to". Terms "first, second, and third" are only used as indications and do not impose numerical requirements or establish an order. Various embodiments of the present disclosure can exist in a form of a range. It should be understood that the description in the form of the range is only for convenience and conciseness, and should not be understood as a rigid limitation of a scope of the present disclosure. Therefore, it should be considered that the range descripted has specifically disclosed all possible sub ranges and a single value within the range.

Referring to FIG. 2 to FIG. 6, embodiments of the present disclosure provide a display panel and a display device. The display panel 2 includes a display area 1000 and a frame area 2000 adjacent to the display area 1000. The frame area 2000 includes a substrate 10, a signal wiring 21, a planarization layer 30, a leading wiring 42, and an encapsulation layer 90 sequentially stacked on the substrate 10. The encapsulation layer 90 includes a first inorganic layer 91 disposed on the leading wiring 42. The display area 1000 includes the substrate 10, the planarization layer 30, and an anode 41 disposed on a side of the planarization layer 30 away from the substrate 10. The leading wiring 42 extends from a side of the anode 41 into the frame area 2000 and is connected to the signal wiring 21. The display panel 2 also includes a barrier layer 80 disposed between the leading wiring 42 and the first inorganic layer 91, and an orthogonal projection of the barrier layer 80 on the substrate 10 covers an orthogonal projection of the leading wiring 42 on the substrate 10.

It should be noted that a plasma enhanced chemical vapor deposition (PECVD) method is generally used to prepare inorganic layers of an encapsulation layer in the existing art. In practice, during the production of the inorganic layers, a mask may be provided to be attached on a substrate to shield certain functional areas, so as to avoid damage to wirings in the functional areas. In contrast, because a frame area of a display panel in the existing art includes a substrate, and a signal wiring, a planarization layer, and a leading wiring sequentially disposed on the substrate, a part of the leading wiring exposed outside of the mask may be bombarded by plasma, and metal ions present in the leading wiring are bombarded out by the plasma and attached to the edges of the mask, resulting in the change of the magnetic field due to the bombarded metal ions, which affects the distribution of plasma gas, resulting in uneven thickness of the inorganic layer at the edges of the mask, affecting the ability of the inorganic layer to block water and oxygen.

It can be understood that the embodiments of the present disclosure can make a thickness of the first inorganic layer uniform to improve an ability of the encapsulation layer to block water and oxygen by designing the barrier layer being disposed between the leading wiring and the first inorganic layer, and the orthogonal projection of the barrier layer on the substrate covering the orthogonal projection of the leading wiring on the substrate. In contrast, when using a plasma enhanced chemical vapor deposition method to prepare the first inorganic layer in the existing art, because the metal ions in the leading wiring are easily bombarded out by plasma and attached to the edges of the mask, the distribution of plasma gas may be affected due to changes of a magnetic field caused by the bombarded metal ions, resulting in uneven thickness of the first inorganic layer at the edges of the mask.

Technical solutions of the present disclosure are described in combination with specific embodiments.

Embodiment 1

Figure 2:
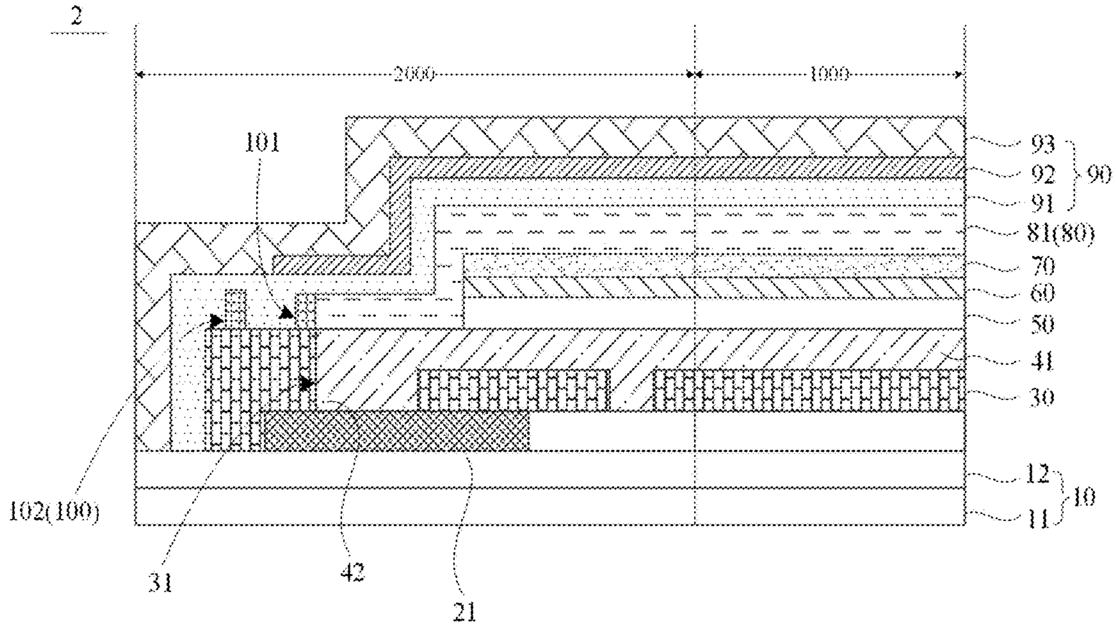
FIG. 2 is a first schematic cross-sectional diagram of a display panel provided by an embodiment of the present disclosure.

Referring to FIG. 2, it is an embodiment of the present disclosure illustrating a first schematic cross-sectional diagram of a display panel.

The embodiment provides a display panel 2 including a display area 1000 and a frame area 2000 adjacent to the display area 1000. It can be understood that the display panel 2 may be a liquid crystal display panel or an active light-emitting display panel, such as an organic light-emitting diode (OLED) display panel, an active matrix organic light-emitting diode (AMOLED) display panel, a passive matrix OLED display panel, or a quantum dot light-emitting diode (QLED) display panel. The organic light-emitting diode display panel is taken as an example for the display panel in the embodiment to illustrate a technical solution of the present disclosure.

In the embodiment, the frame area 2000 includes the substrate 10, the signal wiring 21, the planarization layer 30, the leading wiring 42, and the encapsulation layer 90 sequentially stacked on the substrate 10, and the encapsulation layer 90 includes the first inorganic layer 91 disposed on the leading wiring 42. The display area 1000 includes the substrate 10, the planarization layer 30, and the anode 41 disposed on a side of the planarization layer 30 away from the substrate 10.

In the embodiment, the substrate 10 includes a base 11, a blocking layer 12, and an array substrate (not shown in the figures) disposed in stack. The base 11 may be a rigid base 11 or a flexible base 11. When the base 11 is the rigid base, a material of the rigid base may be metal or glass. When the base 11 is the flexible base, a material of the flexible base may include at least one of acrylic resin, methacrylic resin, polyisoprene, vinyl resin, epoxy resin, polyurethane-based resin, cellulose resin, siloxane resin, polyimide-based resin, and polyamide-based resin. Preferably, the base 11 is the flexible base, and the material of the base 11 is polyimide. A material of the blocking layer 12 includes but is not limited to a material with a water absorption performance such as silicon nitride (SiNX) and/or silicon oxide (SiOX). The array substrate may be a thin film transistor (TFT) array substrate, and a thin film transistor in the TFT array substrate may be a top-gate transistor or a bottom-gate transistor. This embodiment does not make specific limitations on them.

Furthermore, the display area 1000 also includes a pixel definition layer 50, a light-emitting layer 60, a common layer (not shown in the figures), and a cathode 70 sequentially stacked on the anode 41. The common layer includes at least one of a hole injection layer, a hole transport layer, an electron transport layer, and an electron injection layer. A material of the anode 41 includes but is not limited to indium tin oxide (ITO). The signal wiring 21 may be a VSS wiring or a VDD wiring. The leading wiring 42 extends from a side of the anode 41 into the frame area 2000. The planarization layer 30 includes a first via hole 31, and the leading wiring 42 is connected to the signal wiring 21 through the first via hole 31. In the display panel 2, the VDD wiring is connected to an anode end of the display panel 2 for transmitting an anodic voltage, and the VSS wiring is connected to a cathode end of the display panel 2 for transmitting a cathodic voltage. This embodiment takes the signal wiring 21 as the VSS wiring as an example for illustration.

In the embodiment, the display panel 2 includes a dam part 100 disposed between the planarization layer 30 and the encapsulation layer 90, and the dam part 100 is disposed at a side of the leading wiring 42 away from the display area 1000. It can be understood that the dam part 100, the barrier layer 80, and the encapsulation layer 90 in the embodiment are configured to effectively encapsulate OLED devices in the display area 1000 and a wiring structure in the frame area 2000. A main structure of each of the OLED devices includes the anode 41, the cathode 70, and the light-emitting layer 60 disposed between the anode 41 and the cathode 70 disposed in stack. The anode 41 and the light-emitting layer 60 of the OLED devices are separated from each other through the pixel definition layer 50. The cathodes 70 of the OLED devices form an integrated structure, or the cathodes 70 of a number of the OLED devices are connected to form an integrated structure.

The dam part 100 is made of an organic material, such as polyimide, or the like. The encapsulation layer 90 may be a single-layer structure or a stacked-layer structure. The embodiment takes the stacked-layer structure which is formed by an alternate arrangement of inorganic material layers and organic material layers as an example of the encapsulation layer 90 to illustrate the technical solution of the present disclosure. Specifically, in the embodiment, the encapsulation layer 90 includes the first inorganic layer 91, an organic layer 92, and a second inorganic layer 93 sequentially stacked on the cathode 70. Both of the first inorganic layer 91 and the second inorganic layer 93 cover the dam part 100, and the organic layer 92 is disposed at a side of the dam part 100 close to the display area 1000.

Furthermore, in the embodiment, the barrier layer 80 directly contacts with a side of the dam part 100 close to the leading wiring 42 in the frame area 2000. Specifically, the dam part 100 includes a first dam 101 and a second dam 102 spaced apart, and the first dam 101 is disposed at a side of the second dam 102 close to the display area 1000. A height of the first dam 101 is greater than a thickness of the leading wiring 42, and the leading wiring 42 extends from a side of the anode 41 to the first dam 101. The barrier layer 80 directly contacts with a side of the first dam 101 close to the leading wiring 42, and an orthogonal projection of the barrier layer 80 on the substrate 10 covers an orthogonal projection of the leading wiring 42 on the substrate 10.

It can be understood that compared to a display panel 2 in the existing art, the embodiment, by designing the height of the first dam 101 being greater than the thickness of the leading wiring 42, and the leading wiring 42 extending from a side of the anode 41 to the first dam 101, reduces an area of the leading wiring 42, so as to reduce a total amount of substances/metal ions bombarded out by plasma, thereby weakening an influence of a plasma enhanced chemical vapor deposition method on a thickness of the first inorganic layer 91. In the existing art, because a first inorganic layer 91 directly contacts with a leading wiring 42, and the plasma enhanced chemical vapor deposition method is used to prepare the first inorganic layer 91, a part of the leading wiring 42 exposed outside of the mask may be bombarded by high-energy plasma, and indium ions and tin ions in the leading wiring 42 are easily bombarded out and attached to the edges of a mask, which affects the distribution of plasma gas caused by the change of a magnetic field due to the bombarded metal ions, resulting in an uneven thickness of the first inorganic layer 91 at the edges of the mask. In the embodiment, by designing the barrier layer 80 directly contacting with a side of the first dam 101 close to the leading wiring 42, and the orthogonal projection of the barrier layer 80 on the substrate 10 covering the orthogonal projection of the leading wiring 42 on the substrate 10, the above-mentioned phenomenon(s) can be avoided.

Further, in the embodiment, the barrier layer 80 includes a light-extracting layer 81 disposed between the cathode 70 and the first inorganic layer 91, and an orthogonal projection of the light-extracting layer 81 on the substrate 10 covers an orthogonal projection of the light-emitting layer 60 on the substrate 10 in the display area 1000. Furthermore, the orthogonal projection of the light-extracting layer 81 on the substrate 10 covers an orthogonal projection of the cathode 70 on the substrate 10, which can avoid the bombarding damage of high-energy plasma to the cathode 70 when using a plasma enhanced chemical vapor deposition method to prepare the first inorganic layer 91 in the existing art, thus avoiding the presence of the uneven thickness of the first inorganic layer 91.

Specifically, in the embodiment, the light-extracting layer 81 extends from the display area 1000 to the first dam 101, and directly contacts with a side of the first dam 101 close to the leading wiring 42. The orthogonal projection of the light-extracting layer 81 on the substrate 10 covers the orthogonal projection of the leading wiring 42 on the substrate 10. It can be understood that the present embodiment can avoid the bombarding damage of high-energy plasma to the leading wiring 42 when using a plasma enhanced chemical vapor deposition method to prepare the first inorganic layer 91 in the existing art by designing the orthogonal projection of the light-extracting layer 81 on the substrate 10 covering the orthogonal projection of the leading wiring 42 on the substrate 10, thereby avoiding the presence of the uneven thickness of the first inorganic layer 91. Meanwhile, the present embodiment can adjust an optical interference distance of the light-extracting layer 81 to suppress reflection of external light by designing the orthogonal projection of the light-extracting layer 81 on the substrate 10 covering the orthogonal projection of the light-emitting layer 60 on the substrate 10 in the display area 1000, thereby improving efficiency of light extraction.

Embodiment 2

Figure 3:
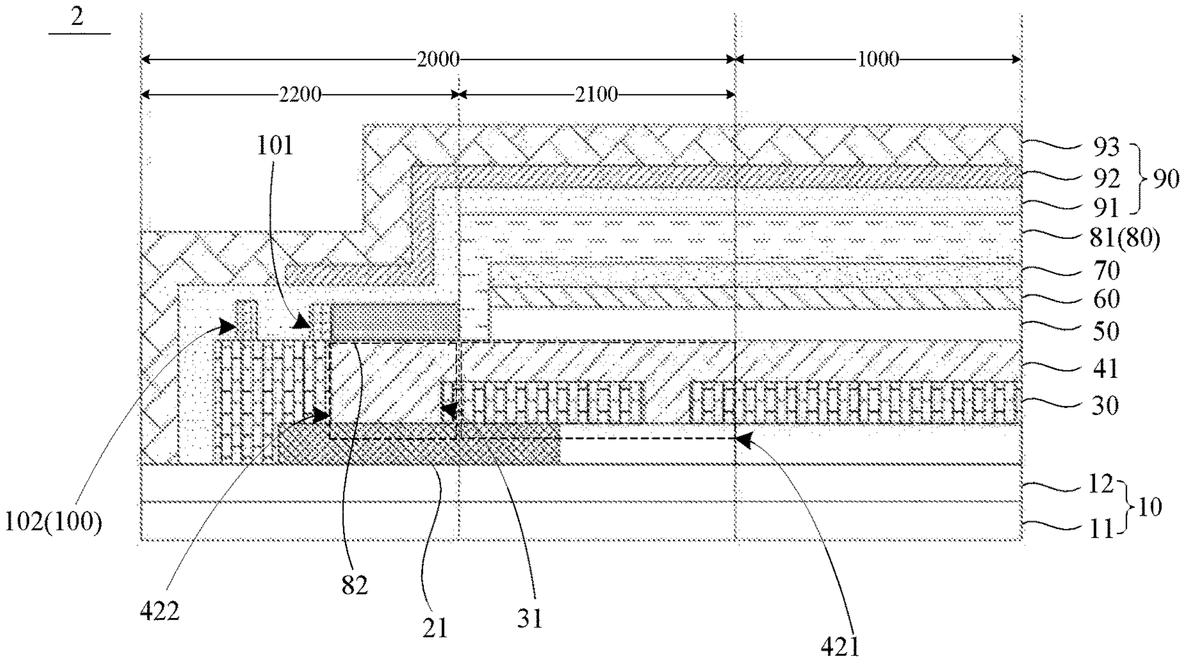
FIG. 3 is a second schematic cross-sectional diagram of a display panel provided by an embodiment of the present disclosure.

Referring to FIG. 3, it is an embodiment of the present disclosure illustrating a second schematic cross-sectional diagram of a display panel In the embodiment, a structure of the display panel is similar to or the same as the display panel provided by the above-mentioned embodiment 1. Please refer to the description of the display panel in the above-mentioned embodiment 1 for the similar or same parts, which will not be repeated here. Difference of the embodiment 2 from the embodiment 1 is shown in the following.

In the embodiment, the leading wiring 42 includes an overlapping part 421 and an exposing part 422 disposed at a side of the overlapping part 421 away from the display area. The light-extracting layer 81 extends from the display area 1000 towards a direction close to the leading wiring 42 and directly contacts with the leading wiring 42. The orthogonal projection of the light-extracting layer 81 on the substrate 10 covers an orthogonal projection of the overlapping part 421 on the substrate 10. The barrier layer 80 includes a barrier sub-layer 82 which extends from a side of the light-extracting layer 81 to the first dam 101, and an orthogonal projection of the barrier sub-layer 82 covers an orthogonal projection of the exposing part 422 on the substrate 10.

Furthermore, in the embodiment, the frame area 2000 includes a first frame area 2100 and a second frame area 2200. The first frame area 2100 is defined between the second frame area 2200 and the display area 1000. The overlapping part 421 is disposed in the first frame area 2100, and the exposing part 422 is disposed in the second frame area 2200. Specifically, the overlapping part 421 extends from a side of the anode 41 to the first frame area 2100, the exposing part 422 extends from a side of the overlapping part 421 to the second frame area 2200, and the overlapping part 421 and the exposing part 422 are disposed in a same layer and connected to each other.

The light-extracting layer 81 extends from the display area 1000 to the first frame area 2100, and directly contacts with the overlapping part 421. The orthogonal projection of the light-extracting layer 81 on the substrate 10 covers the orthogonal projection of the overlapping part 421 on the substrate 10. The barrier sub-layer 82 and the light-extracting layer 81 are disposed in the same layer, the barrier sub-layer 82 directly contacts with the exposing part 422, and the orthogonal projection of the barrier sub-layer 82 on the substrate 10 covers the orthogonal projection of the exposing part 422 on the substrate 10. Specifically, an end of the barrier sub-layer 82 close to the light-extracting layer 81 directly contacts with the light-extracting layer 81, and another end of the barrier sub-layer 82 close to the first dam 101 directly contacts with the first dam 101.

Furthermore, a material of the barrier sub-layer 82 is metal halide, which includes but is not limited to at least one of magnesium fluoride ($MgF_2$), aluminum fluoride ($AlF_3$), sodium fluoride (NaF), and lithium fluoride (LiF). Preferably, the material of the barrier sublayer 82 is LiF.

It can be understood that the present disclosure can avoid an increase of a thickness of the display panel 2 caused by an arrangement of the barrier sub-layer 82 between the leading wiring 42 and the first inorganic layer 91 by designing the barrier sub-layer 82 being in the same layer as the light-extracting layer 81. Meanwhile, by designing a side of the barrier sub-layer 82 close to the light-extracting layer 81 directly contacting with the light-extracting layer 81, a side of the barrier sub-layer 82 close to the first dam 101 directly contacting with the first dam 101, the orthogonal projection of the light-extracting layer 81 on the substrate 10 covering the orthogonal projection of the overlapping part 421 on the substrate 10, and the orthogonal projection of the barrier sub-layer 82 on the substrate 10 covering the orthogonal projection of the exposing part 422 on the substrate 10, the present disclosure can avoid the bombarding damage of high-energy plasma to the leading wiring 42 when using a plasma enhanced chemical vapor deposition method to prepare the first inorganic layer 91 in the existing art, thereby avoiding the presence of an uneven thickness of the first inorganic layer 91.

Embodiment 3

Figure 4:
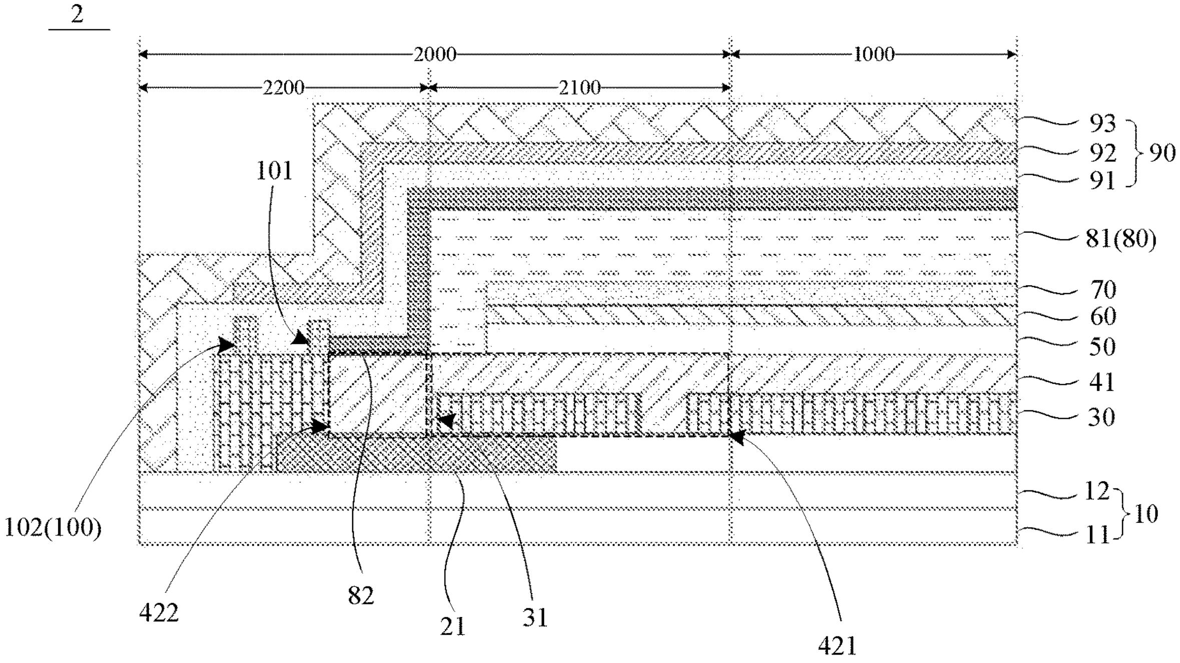
FIG. 4 is a third schematic cross-sectional diagram of a display panel provided by an embodiment of the present disclosure.

Referring to FIG. 4, it is an embodiment of the present disclosure illustrating a third schematic cross-sectional diagram of a display panel.

In the embodiment, a structure of the display panel is similar to or the same as the display panel provided by the above-mentioned embodiment 2. Please refer to the description of the display panel in the above-mentioned embodiment 2 for the similar or same parts, which will not be repeated here. Difference of the embodiment 3 from the embodiment 1 or 2 is shown in the following.

In the embodiment, the barrier layer 80 includes the barrier sub-layer 82 disposed between the light-extracting layer 81 and the first inorganic layer 91, the barrier sub-layer 82 extends from the display area 1000 to the first dam 101, and an orthogonal projection of the barrier sub-layer 82 on the substrate 10 covers an orthogonal projection of the leading wiring 42 on the substrate 10.

Specifically, the light-extracting layer 81 extends from the display area 1000 towards a direction close to the leading wiring 42 and directly contacts with the leading wiring 42. An orthogonal projection of the light-extracting layer 81 on the substrate 10 covers an orthogonal projection of at least a part of the leading wiring 42 on the substrate 10. An end of the barrier sub-layer 82 close to the first dam 101 directly contacts with the first dam 101, and an orthogonal projection of the barrier sub-layer 82 on the substrate 10 covers the orthogonal projection of the light-extracting layer 81 on the substrate 10.

It can be understood that the present disclosure can avoid the bombarding damage of high-energy plasma to the leading wiring 42 when using plasma enhanced chemical vapor deposition method to prepare the first inorganic layer 91 in the existing art by designing the barrier sub-layer 82 extending from the display area 1000 to the first dam 101, and the orthogonal projection of the barrier sub-layer 82 on the substrate 10 covering the orthogonal projection of the leading wiring 42 on the substrate 10, thereby avoiding the presence of an uneven thickness of the first inorganic layer 91. Meanwhile, by designing the barrier sub-layer 82 being disposed between the light-extracting layer 81 and the first inorganic layer 91, and the orthogonal projection of the barrier sub-layer 82 on the substrate 10 covering the orthogonal projection of the light-extracting layer 81 on the substrate 10, the barrier sub-layer 82 can protect the light-extracting layer 81 and the light-emitting layer 60, thereby avoiding damage to the light-extracting layer 81 and the light-emitting layer 60 during a formation of the encapsulation layer 90.

Embodiment 4

Figure 5:
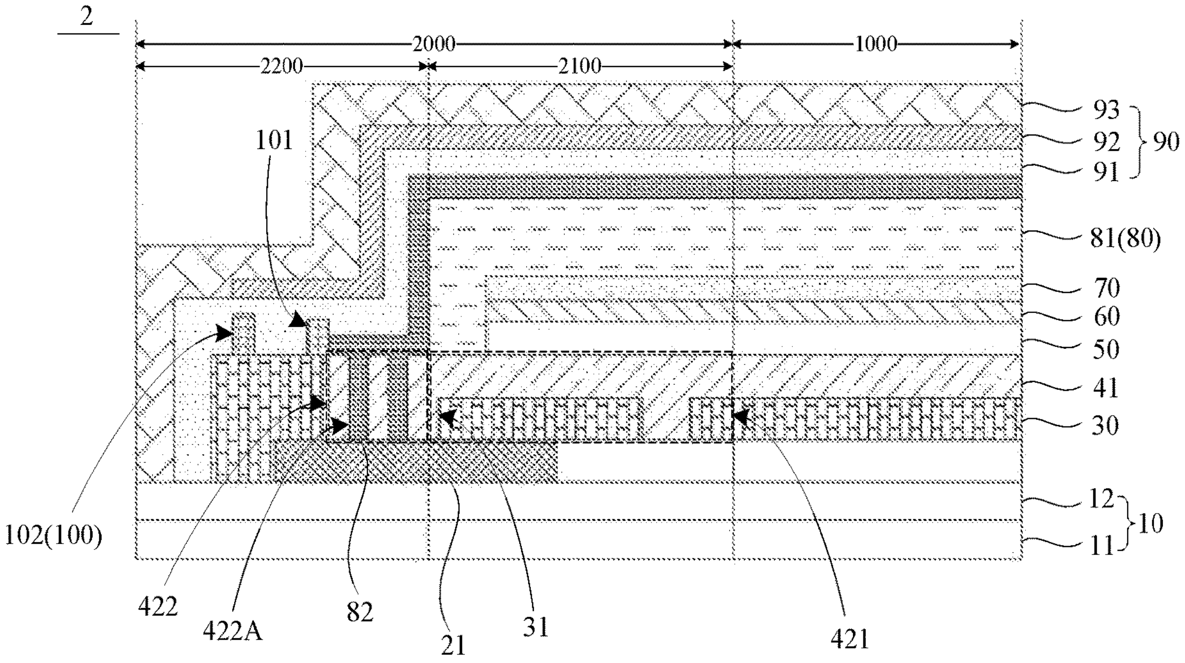
FIG. 5 is a fourth schematic cross-sectional diagram of a display panel provided by an embodiment of the present disclosure.
Figure 6:
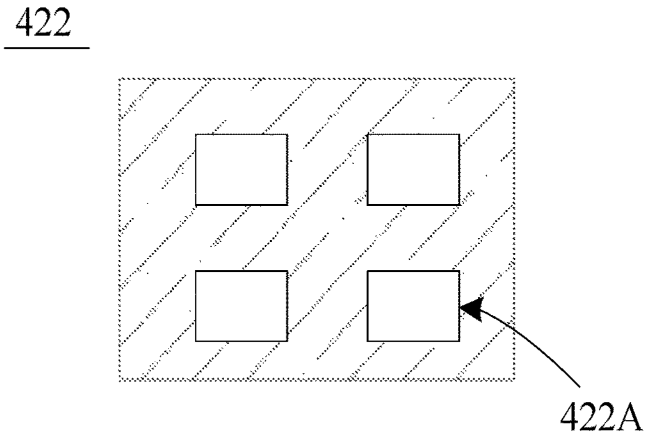
FIG. 6 is a top view of an exposing part provided by an embodiment of the present disclosure.

Referring to FIG. 5 and FIG. 6, FIG. 5 is a fourth schematic cross-sectional diagram of a display panel provided by an embodiment of the present disclosure, and FIG. 6 is a top view of an exposing part provided by the embodiment of the present disclosure.

In the embodiment, a structure of the display panel is similar to or the same as the display panel provided by the above-mentioned embodiment 3. Please refer to the description of the display panel in the above-mentioned embodiment 3 for the same or similar parts, which will not be repeated here. Difference from the above embodiments is detailed in the following.

In the embodiment, the leading wiring 42 includes a plurality of hollow holes 422A passing through the leading wiring 42 in a direction perpendicular to the substrate 10. A shape of the hollow hole 422A includes but is not limited to one of rectangle, circle, and triangle.

Specifically, in the embodiment, the frame area 2000 includes a first frame area 2100 and a second frame area 2200, and the first frame area 2100 is defined between the second frame area 2200 and the display area 1000. The leading wiring 42 includes an overlapping part 421 and an exposing part 422, the overlapping part 421 is disposed in the first frame area 2100 and extends from one side of the anode 41 to the first frame area 2100, the exposing part 422 is disposed in the second frame area 2200 and extends from a side of the overlapping part 421 to the second frame area 2200, and the overlapping part 421 and the exposing part 422 are disposed in a same layer and connected to each other.

The light-extracting layer 81 extends from the display area 1000 into the first frame area 2100 and directly contacts with the overlapping part 421, and an orthogonal projection of the light-extracting layer 81 on the substrate 10 covers an orthogonal projection of the overlapping part 421 on the substrate 10. The barrier sub-layer 82 is disposed in a same layer as the light-extracting layer 81, and directly contacts with the exposing part 422. An orthogonal projection of the barrier sub-layer 82 on the substrate 10 covers an orthogonal projection of the exposing part 422 on the substrate 10.

The exposing part 422 includes a plurality of hollow holes 422A passing through the exposing part 422 in the direction perpendicular to the substrate 10, and the plurality of hollow holes 422A are filled with the barrier sub-layer 82.

It can be understood that compared to the display panel 2 in the existing art, the present disclosure can reduce an area of the leading wiring 42, and reduce a total amount of substances/metal ions bombarded out by plasma by designing the exposing part 422 including the plurality of hollow holes 422A which pass through the exposing part 422 in the direction perpendicular to the substrate 10, and the plurality of hollow holes 422A being filled with the barrier sub-layer 82, thereby weakening an influence of an existing plasma enhanced chemical vapor deposition method on a thickness of the first inorganic layer 91.

It should be noted that the design of the exposing part 422 including the plurality of hollow holes 422A which pass through the exposing part 422 in the direction perpendicular to the substrate 10, and the plurality of hollow holes 422A being filled with the barrier sub-layer 82 is taken only for an illustrative purpose. In other embodiments, such as the embodiment 1, the embodiment 2, and the embodiment 3, all of the leading wirings 42 in which may include the plurality of hollow holes 422A. This embodiment does not impose specific limitations on them.

An embodiment provides a display device that includes a display panel as described in any of the above-mentioned embodiments.

It can be understood that the display panel has been described in detail in the above-mentioned embodiments, and will not be repeated here.

In specific applications, the display device may be a display screen of a device, such as an intelligent phone, a tablet, a laptop, an intelligent wristband, an intelligent watch, intelligent glasses, an intelligent helmet, a desktop computer, an intelligent television, or a digital camera, and can even be applied to an electronic device with a flexible display screen.

In view of the foregoing, the present disclosure provides the display panel and the display device, and the display panel includes the display area and the frame area adjacent to the display area. The frame area includes the substrate, and the signal wiring, the planarization layer, the leading wiring, and the encapsulation layer sequentially disposed on the substrate, and the encapsulation layer includes the first inorganic layer disposed on the leading wiring. The display area includes the substrate, the planarization layer, and the anode disposed on the side of the planarization layer away from the substrate, and the leading wiring extends from the side of the anode to the frame area and is connected to the signal wiring. The present disclosure, by designing the barrier layer being disposed between the leading wiring and the first inorganic layer, and the orthogonal projection of the barrier layer on the substrate covering the orthogonal projection of the leading wiring on the substrate, makes a thickness of the first inorganic layer uniform to improve an ability of the encapsulation layer to block water and oxygen. In contrast, when using a plasma enhanced chemical vapor deposition method to prepare the first inorganic layer in the existing art, because the metal ions in the leading wiring are easily bombarded out by plasma and attached to the edges of the mask, the distribution of plasma gas may be affected due to changes of a magnetic field caused by the bombarded metal ions, resulting in a phenomenon of an uneven thickness of the first inorganic layer at the edges of the mask.

Based on the above, although the present disclosure has been disclosed with above mentioned preferred embodiments, the preferred embodiments are not intended to limit the present disclosure. Those skilled in the art can make various modifications and embellishments without departing from a spirit and a scope of the present disclosure. Therefore, the scope of protection of the present disclosure is subject to a scope defined in the claims.

What is claimed is:

1. A display panel, comprising a display area and a frame area adjacent to the display area;

wherein the frame area comprises a substrate, and a signal wiring, a planarization layer, a leading wiring, and an encapsulation layer sequentially stacked on the substrate; and the encapsulation layer comprises a first inorganic layer disposed on the leading wiring; and wherein the display area comprises the substrate, the planarization layer, and an anode disposed on a side of the planarization layer away from the substrate, the anode is connected to the leading wiring, and the leading wiring extends from a side surface of the anode close to the frame area into the frame area and is connected to the signal wiring;

wherein the display panel further comprises a barrier layer disposed between the leading wiring and the first inorganic layer, and an orthographic projection of the barrier layer on the substrate covers an orthographic projection of the leading wiring on the substrate; and wherein the display panel comprises a dam part disposed between the planarization layer and the encapsulation layer, the dam part is disposed at a side of the leading wiring away from the display area, and the barrier layer directly contacts with a side of the dam part close to the leading wiring in the frame area.

2. The display panel of claim 1, wherein the dam part comprises a first dam and a second dam spaced apart, and the first dam is disposed at a side of the second dam close to the display area; and wherein a height of the first dam is greater than a thickness of the leading wiring, the leading wiring extends from a side of the anode to the first dam, and the barrier layer directly contacts with a side of the first dam close to the leading wiring.

3. The display panel of claim 2, wherein the display area comprises a pixel definition layer, a light-emitting layer, a common layer, and a cathode sequentially stacked on the anode, and the first inorganic layer is disposed on a side of the cathode away from the common layer; and the barrier layer comprises a light-extracting layer disposed between the cathode and the first inorganic layer, and an orthographic projection of the light-extracting layer on the substrate covers an orthographic projection of the light-emitting layer on the substrate.

4. The display panel of claim 3, wherein the light-extracting layer extends from the display area to the first dam and directly contacts with a side of the first dam close to the leading wiring; and wherein the orthographic projection of the light-extracting layer on the substrate covers the orthographic projection of the leading wiring on the substrate.

5. The display panel of claim 3, wherein the leading wiring comprises an overlapping part and an exposing part disposed at a side of the overlapping part away from the display area;

wherein the light-extracting layer extends from the display area towards a direction close to the leading wiring and directly contacts the overlapping part, and the orthogonal projection of the light-extracting layer on the substrate covers an orthogonal projection of the overlapping part on the substrate; and wherein the barrier layer comprises a barrier sub-layer extending from a side of the light-extracting layer to the first dam, and an orthogonal projection of the barrier sub-layer on the substrate covers an orthogonal projection of the exposing part on the substrate.

6. The display panel of claim 3, wherein the barrier layer comprises a barrier sub-layer disposed between the light-extracting layer and the first inorganic layer, and extends from the display area to the first dam, and an orthogonal projection of the barrier sub-layer on the substrate covers the orthogonal projection of the leading wiring on the substrate.

7. The display panel of claim 5, wherein the barrier sub-layer is made of at least one material selected from magnesium fluoride, aluminum fluoride, sodium fluoride, and lithium fluoride.

8. The display panel of claim 1, wherein the leading wiring comprises a plurality of hollow holes passing through the leading wiring in a direction perpendicular to the substrate.

9. The display panel of claim 8, wherein the hollow holes have a shape selected from rectangle, circle, and triangle.

10. A display device comprising a display panel, wherein the display panel comprises a display area and a frame area adjacent to the display area;

wherein the frame area comprises a substrate, and a signal wiring, a planarization layer, a leading wiring, and an encapsulation layer sequentially stacked on the substrate; and the encapsulation layer comprises a first inorganic layer disposed on the leading wiring; and wherein the display area comprises the substrate, the planarization layer, and an anode disposed on a side of the planarization layer away from the substrate, the anode is connected to the leading wiring, and the leading wiring extends from a side surface of the anode close to the frame area into the frame area and is connected to the signal wiring;

wherein the display panel further comprises a barrier layer disposed between the leading wiring and the first inorganic layer, and an orthographic projection of the barrier layer on the substrate covers an orthographic projection of the leading wiring on the substrate; and wherein the display panel comprises a dam part disposed between the planarization layer and the encapsulation layer, the dam part is disposed at a side of the leading wiring away from the display area, and the barrier layer directly contacts with a side of the dam part close to the leading wiring in the frame area.

11. The display panel of claim 10, wherein the dam part comprises a first dam and a second dam spaced apart, and the first dam is disposed at a side of the second dam close to the display area; and wherein a height of the first dam is greater than a thickness of the leading wiring, the leading wiring extends from a side of the anode to the first dam, and the barrier layer directly contacts with a side of the first dam close to the leading wiring.

12. The display panel of claim 11, wherein the display area comprises a pixel definition layer, a light-emitting layer, a common layer, and a cathode sequentially stacked on the anode, and the first inorganic layer is disposed on a side of the cathode away from the common layer; and wherein the barrier layer comprises a light-extracting layer disposed between the cathode and the first inorganic layer, and an orthographic projection of the light-extracting layer on the substrate covers an orthographic projection of the light-emitting layer on the substrate.

13. The display panel of claim 12, wherein the light-extracting layer extends from the display area to the first dam and directly contacts with a side of the first dam close to the leading wiring; and wherein the orthographic projection of the light-extracting layer on the substrate covers the orthographic projection of the leading wiring on the substrate.

14. The display panel of claim 12, wherein the leading wiring comprises an overlapping part and an exposing part disposed at a side of the overlapping part away from the display area;

wherein the light-extracting layer extends from the display area towards a direction close to the leading wiring and directly contacts the overlapping part, and the orthogonal projection of the light-extracting layer on the substrate covers an orthogonal projection of the overlapping part on the substrate; and wherein the barrier layer comprises a barrier sub-layer extending from a side of the light-extracting layer to the first dam, and an orthogonal projection of the barrier sub-layer on the substrate covers an orthogonal projection of the exposing part on the substrate.

15. The display panel of claim 12, wherein the barrier layer comprises a barrier sub-layer disposed between the light-extracting layer and the first inorganic layer, and extends from the display area to the first dam, and an orthogonal projection of the barrier sub-layer on the substrate covers the orthogonal projection of the leading wiring on the substrate.

16. The display panel of any of claim 14, wherein the barrier sub-layer is made of at least one material selected from magnesium fluoride, aluminum fluoride, sodium fluoride, and lithium fluoride.

17. The display panel of claim 10, wherein the leading wiring comprises a plurality of hollow holes passing through the leading wiring in a direction perpendicular to the substrate.

18. The display panel of claim 17, wherein the hollow holes have a shape selected from rectangle, circle, and triangle.

19. A display panel, comprising a display area and a frame area adjacent to the display area;

wherein the frame area comprises a substrate, and a signal wiring, a planarization layer, a leading wiring, and an encapsulation layer sequentially stacked on the substrate; and the encapsulation layer comprises a first inorganic layer disposed on the leading wiring; and wherein the display area comprises the substrate, the planarization layer, and an anode disposed on a side of the planarization layer away from the substrate, the anode is connected to the leading wiring, and the leading wiring extends from a side surface of the anode close to the frame area into the frame area and is connected to the signal wiring;

wherein the display panel further comprises a barrier layer disposed between the leading wiring and the first inorganic layer, and an orthographic projection of the barrier layer on the substrate covers an orthographic projection of the leading wiring on the substrate; and wherein the leading wiring comprises a plurality of hollow holes passing through the leading wiring in a direction perpendicular to the substrate.

* * * * *